(12) United States Patent
Loglisci

(10) Patent No.: US 9,423,428 B2
(45) Date of Patent: Aug. 23, 2016

(54) MIXED CURRENT SENSOR AND METHOD FOR FITTING SAID SENSOR

(71) Applicant: Schneider Electric Industries SAS, Rueil-Malmaison (FR)

(72) Inventor: David Loglisci, Uriage (FR)

(73) Assignee: SCHNEIDER ELECTRIC INDUSTRIES SAS, Rueil-Malmaison (FR)

(*) Notice: Subject to any disclaimer, the term of this patent is extended or adjusted under 35 U.S.C. 154(b) by 251 days.

(21) Appl. No.: 14/046,082

(22) Filed: Oct. 4, 2013

(65) Prior Publication Data
US 2014/0132249 A1 May 15, 2014

(30) Foreign Application Priority Data
Nov. 15, 2012 (FR) ...................... 12 60862

(51) Int. Cl.
| | | |
|---|---|---|
| G01R 19/00 | (2006.01) |
| G01R 15/18 | (2006.01) |
| H01F 38/30 | (2006.01) |
| H01F 27/02 | (2006.01) |
| H01F 27/28 | (2006.01) |
| H01F 27/29 | (2006.01) |
| H01F 27/30 | (2006.01) |

(52) U.S. Cl.
CPC ......... *G01R 19/0092* (2013.01); *G01R 15/181* (2013.01); *H01F 27/02* (2013.01); *H01F 27/2823* (2013.01); *H01F 27/29* (2013.01); *H01F 27/306* (2013.01); *H01F 38/30* (2013.01); *G01R 15/183* (2013.01)

(58) Field of Classification Search
USPC ......... 324/105, 76.11, 123 R, 144, 124, 654, 324/150, 126, 192, 72, 127, 301, 117 R, 324/117 H
See application file for complete search history.

(56) References Cited

U.S. PATENT DOCUMENTS

| | | | |
|---|---|---|---|
| 4,611,191 A | | 9/1986 | Souchere |
| 5,834,934 A | * | 11/1998 | Baurand et al. ............... 324/127 |
| 6,313,623 B1 | | 11/2001 | Kojovic et al. |
| 7,656,649 B2 | * | 2/2010 | Loy ...................... G01R 22/065 324/142 |

(Continued)

FOREIGN PATENT DOCUMENTS

WO WO 01/57543 A1 8/2001

OTHER PUBLICATIONS

French Preliminary Search Report issued Jul. 26, 2013, in French 1260862, filed Nov. 15, 2012 (with English Translation of Categories of Cited Documents).

*Primary Examiner* — Patrick Assouad
*Assistant Examiner* — Douglas X Rodriguez
(74) *Attorney, Agent, or Firm* — Oblon, McClelland, Maier & Neustadt, L.L.P.

(57) ABSTRACT

The invention relates to a mixed current sensor comprising in a case:
a current measurement device comprising a first coil;
a magnetic current sensor having a second coil,
electronic measurement means.
Said sensor comprises:
a first cassette comprising first linking means arranged to fix said cassette to the first coil by clip-fastening and second linking means arranged to secure the measurement device on the case;
a second cassette comprising third linking means arranged to secure and fix both the magnetic sensor on the case and the first cassette and the measurement device by clip-fastening on said case.

16 Claims, 11 Drawing Sheets

(56) References Cited

U.S. PATENT DOCUMENTS

| | | | |
|---|---|---|---|
| 2004/0183522 A1* | 9/2004 | Gunn et al. | 324/126 |
| 2005/0253573 A1* | 11/2005 | Budillon et al. | 324/126 |
| 2008/0007249 A1 | 1/2008 | Wilkerson et al. | |
| 2008/0048646 A1 | 2/2008 | Wilkerson et al. | |
| 2010/0194375 A1* | 8/2010 | Cooper | 324/72 |
| 2011/0025304 A1* | 2/2011 | Lint et al. | 324/150 |
| 2011/0025305 A1* | 2/2011 | Lint et al. | 324/150 |
| 2011/0116197 A1 | 5/2011 | Zylstra | |
| 2011/0148561 A1* | 6/2011 | Lint et al. | 336/192 |
| 2012/0256617 A1* | 10/2012 | Moreux et al. | 324/126 |
| 2013/0063131 A1* | 3/2013 | Chamarti et al. | 324/150 |
| 2013/0193987 A1* | 8/2013 | Kesler et al. | 324/654 |
| 2013/0221630 A1* | 8/2013 | Tavolino | 280/79.2 |
| 2014/0125321 A1* | 5/2014 | Dames et al. | 324/127 |

* cited by examiner

MIXED CURRENT SENSOR AND METHOD FOR FITTING SAID SENSOR

BACKGROUND OF THE INVENTION

The invention relates to a mixed current sensor comprising, in a case, a current measurement device comprising a first coil of Rogowski type and a magnetic current sensor having a second coil wound around a magnetic circuit. The current measurement device and the magnetic current sensor are arranged so as to have the same primary circuit. The mixed current sensor comprises electronic means for performing electric current acquisition and measurement.

The invention also relates to a method for fitting the mixed current sensor.

STATE OF THE ART

The use of a current measurement device comprising inductive Rogowski sensors is extensively described in the literature.

Current measurement devices of Rogowski type comprise a support made from non-magnetic material placed around a current conductor or line in which the current to be measured is flowing. A conducting wire is coiled on the support to form a secondary winding. The assembly forms a transformer where said current conductor or line forms a primary winding and said secondary winding supplies a measurement signal. The voltage supplied at the terminals of the secondary winding is directly proportional to the intensity of the electric current flowing in the current conductor or line. The absence of a magnetic core liable to be saturated enables a large measurement range to be obtained.

Certain solutions (U.S. Pat. No. 4,611,191, WO01/57543 A1) comprise coils in the form of ring-shaped solenoids. The electric wire can then be coiled on a ring-shaped non-conducting support of circular or rectangular cross-section. Although they are very efficient, solutions using a closed torus ring remain difficult to industrialize on account of the geometry of the ring. Furthermore, problems of fitting the coils on their support are encountered.

SUMMARY OF THE INVENTION

The object of the invention is therefore to remedy the drawbacks of the state of the art so as to propose an electric current measurement device of simplified industrialization.

The mixed current sensor according to the invention comprises a first linking cassette comprising first linking means arranged to position and secure said cassette to the first coil by clip-fastening and second linking means arranged to position and secure said cassette and the measurement device on the case. A second linking cassette comprises third linking means arranged to position and secure both the magnetic sensor and the first cassette and the measurement device by clip-fastening on the case. The first and second cassettes comprise electric pins respectively connecting the first and second coils to the electronic acquisition means.

According to a mode of development of the invention, the first coil of the measurement current device is wound on an insulating shell comprising clip-fastening means designed to collaborate with the first linking means of the linking cassette.

Advantageously, the clip-fastening means of the shell and the first linking means of the linking cassette form a tenon and mortar type system.

According to this mode of development of the invention, the second linking means of the first linking cassette comprise a positioning slide salient with respect to the body of said linking cassette, said positioning slide being designed to be housed in a groove of a housing of the case to form a tenon and mortar type system.

The assembly formed by the second coil and the magnetic circuit is preferably fixed on an insulating support plate, the second linking cassette being securedly fixed to the insulating support plate.

According to this mode of development of the invention, the third linking means of the second linking cassette comprise a positioning slide salient with respect to the body of the second linking cassette, said positioning slide being designed to be housed in the same groove as the positioning slide of the first linking cassette to form a tenon and mortar type system.

The grooves of the housing preferably comprise stop means designed to collaborate with slides of the second cassette at the end of translational movement of said slides in the housing, said stop means being designed to block translational movement of both the first and second cassette.

According to one embodiment, the magnetic current sensor comprises a second coil wound around the magnetic circuit. The assembly formed by the second coil and the magnetic circuit is fixed on the insulating support plate.

The electronic acquisition and measurement means are preferably positioned in a first housing of a base of the case, one of the walls of said housing comprising an opening for passage of the linking cassettes.

Advantageously, the case comprises a first flat cover designed to be fixed by welding onto an outer edge of the walls of the first housing of the base.

Advantageously, the electronic means comprise a printed circuit plate arranged to be positioned inside the walls of the housing, the printed circuit plate comprising holes allowing passage and engagement of the electric pins of the first and second linking cassettes.

Preferably, the base comprises a second housing having walls inside which the magnetic current sensor and the current measurement device are positioned, the outer edge of the walls extending in a plane.

Advantageously, the case comprises a second flat cover designed to be fixed by welding onto an outer edge of the walls of the second housing of the base.

Preferably, the electronic means for performing electric current acquisition and measurement are supplied by the second coil of the magnetic current sensor.

The method for fitting the mixed current sensor as defined above comprises the following steps:
  fixing the first cassette on the insulating shell of the current measurement device, the wires of the first coil being electrically connected to the electric pins of the cassette;
  positioning of the assembly formed by the first cassette and the shell supporting the first coil in the case, the first cassette enabling positioning of the measurement device in the case;
  positioning of the assembly formed by the second cassette and the second coil in the case, the second cassette enabling positioning and fixing:
    of the measurement device on the case;
    of the magnetic current sensor;
  electric welding of the tracks on the coil of the magnetic sensor;
  positioning of the printed circuit plate of the electronic acquisition means inside the walls of the first housing;

welding of the electric pins of the first cassette and of the electric pins of the tracks on the electronic acquisition means;

positioning and welding of a first cover on the outer edges of the walls of the first housing;

positioning and welding of a second cover on the outer edges of the walls of the second housing of the base.

BRIEF DESCRIPTION OF THE DRAWINGS

Other advantages and features will become more clearly apparent from the following description of a particular embodiment of the invention given for non-restrictive example purposes only and represented in the appended drawings in which.

DETAILED DESCRIPTION OF AN EMBODIMENT

Figure 1A:
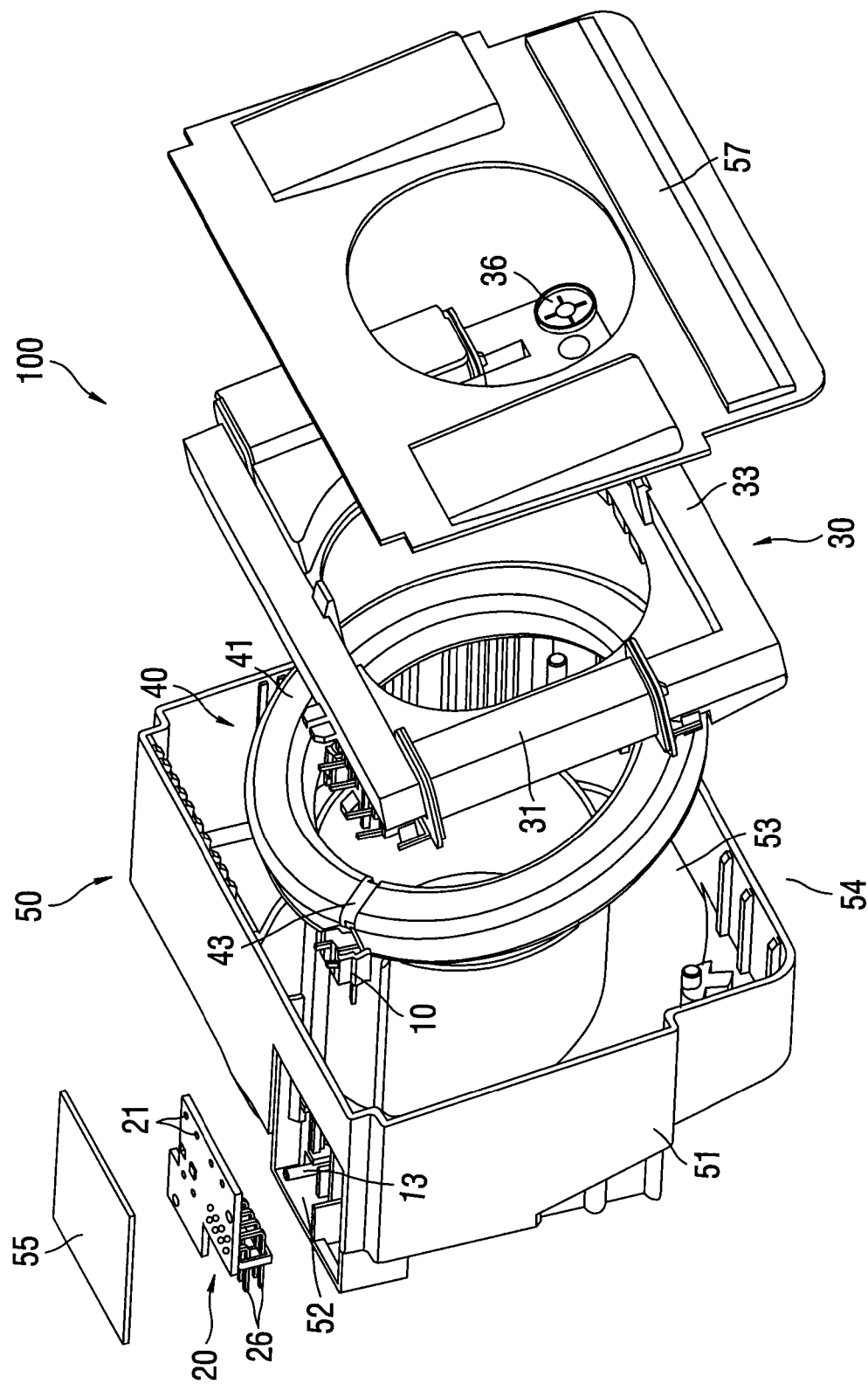
FIGS. 1A and 1B represent exploded views of a mixed electric current sensor according to a preferred embodiment of the invention.

According to a preferred embodiment as represented in FIG. 1, the mixed current sensor 100 comprises a magnetic current sensor 30 and a current measurement device 40 assembled in a case 50.

The current measurement device 40 comprises a first Rogowski coil 41 arranged in such a way that a primary circuit of the magnetic sensor 30 corresponds to the primary circuit of said current measurement device 40. The first coil 41 is composed of an insulating shell 43. As an example embodiment, said shell 43 is of circular shape, hollow, and made from rigid or semi-rigid non-magnetic material, preferably of cylindrical or oval cross-section. A metal wire made from copper or a copper-based alloy is wound on the shell 43.

The magnetic current sensor 30 comprises at least one second coil 31 wound around a magnetic circuit 33.

The case 50 is provided with a central recess 90 enabling passage of the current conductor or line 80 on which the current measurement is performed. This current conductor or line 80 forms the primary circuit of the current measurement device 40. Furthermore, said current conductor or line also forms the first primary circuit of the magnetic current sensor 30.

Figure 1B:
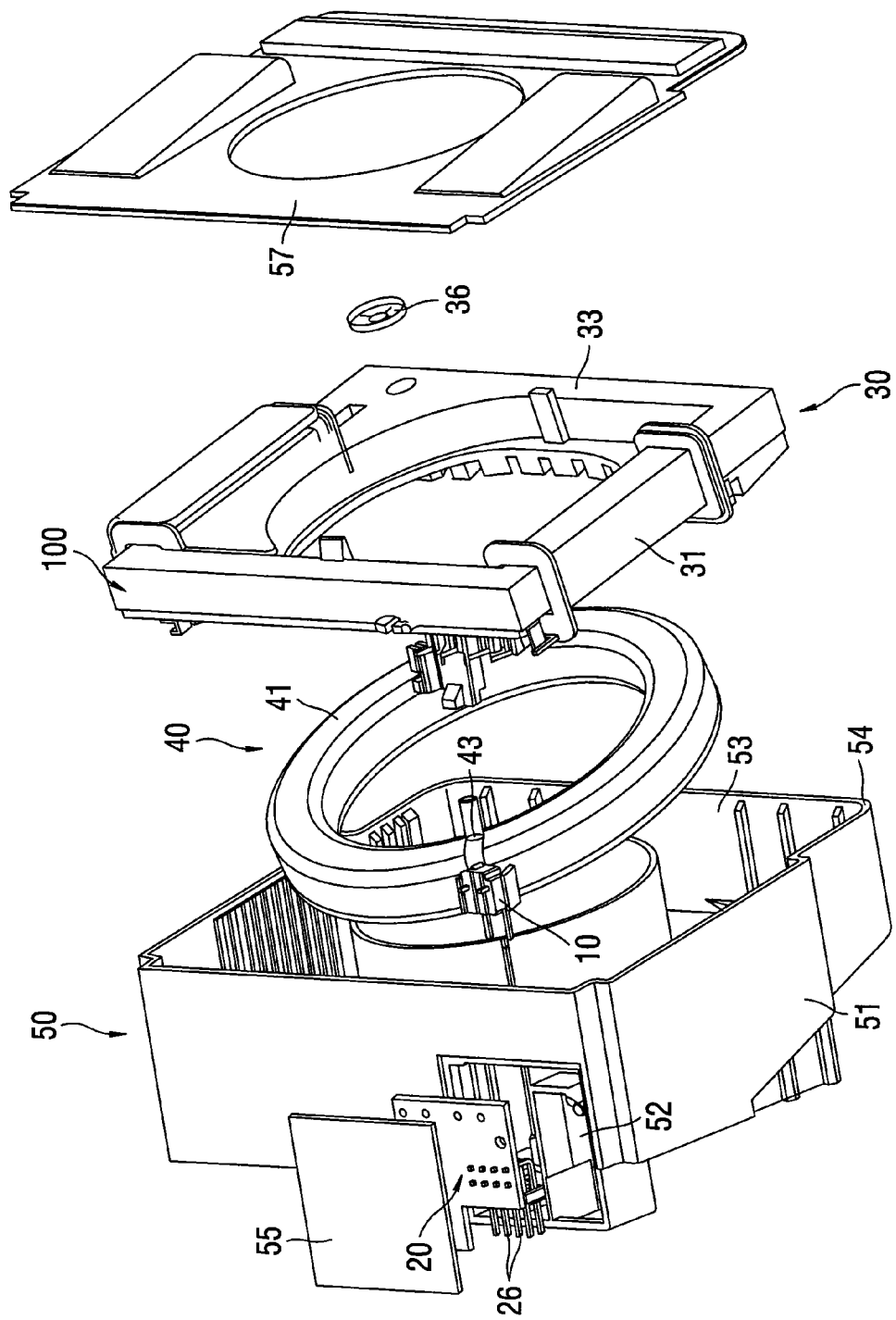
Figure 2A:
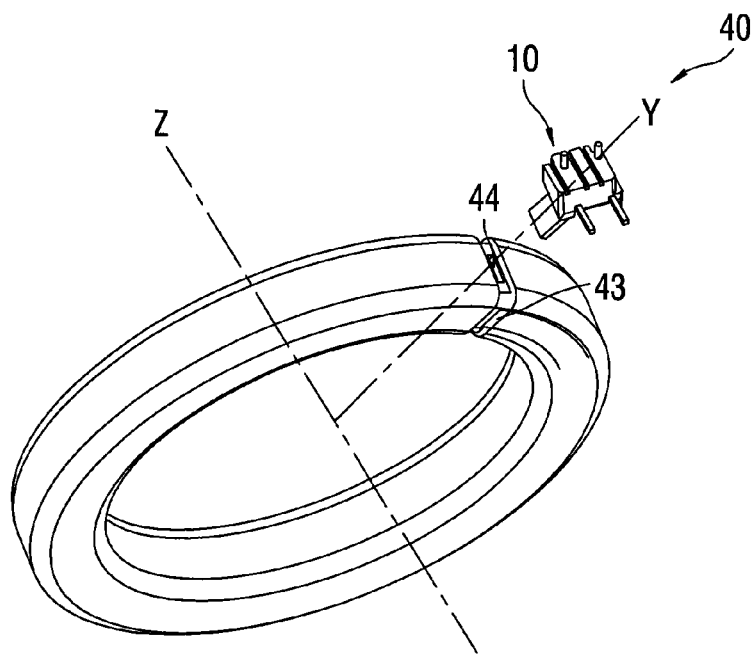
FIGS. 2A and 2B represent perspective views of a current measurement device of the mixed electric current sensor according to FIGS. 1A and 1B.
Figure 2B:
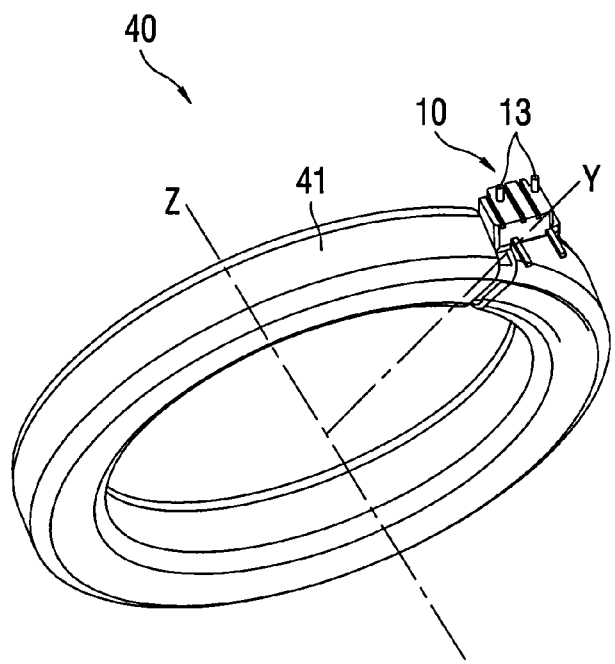

As represented in FIGS. 1A and 1B, the mixed current sensor 100 comprises electronic acquisition and measurement means 20 of the electric current. The case 50 comprises a base 51 comprising a first housing 52 for the electronic acquisition and measurement means 20.

Figure 12:
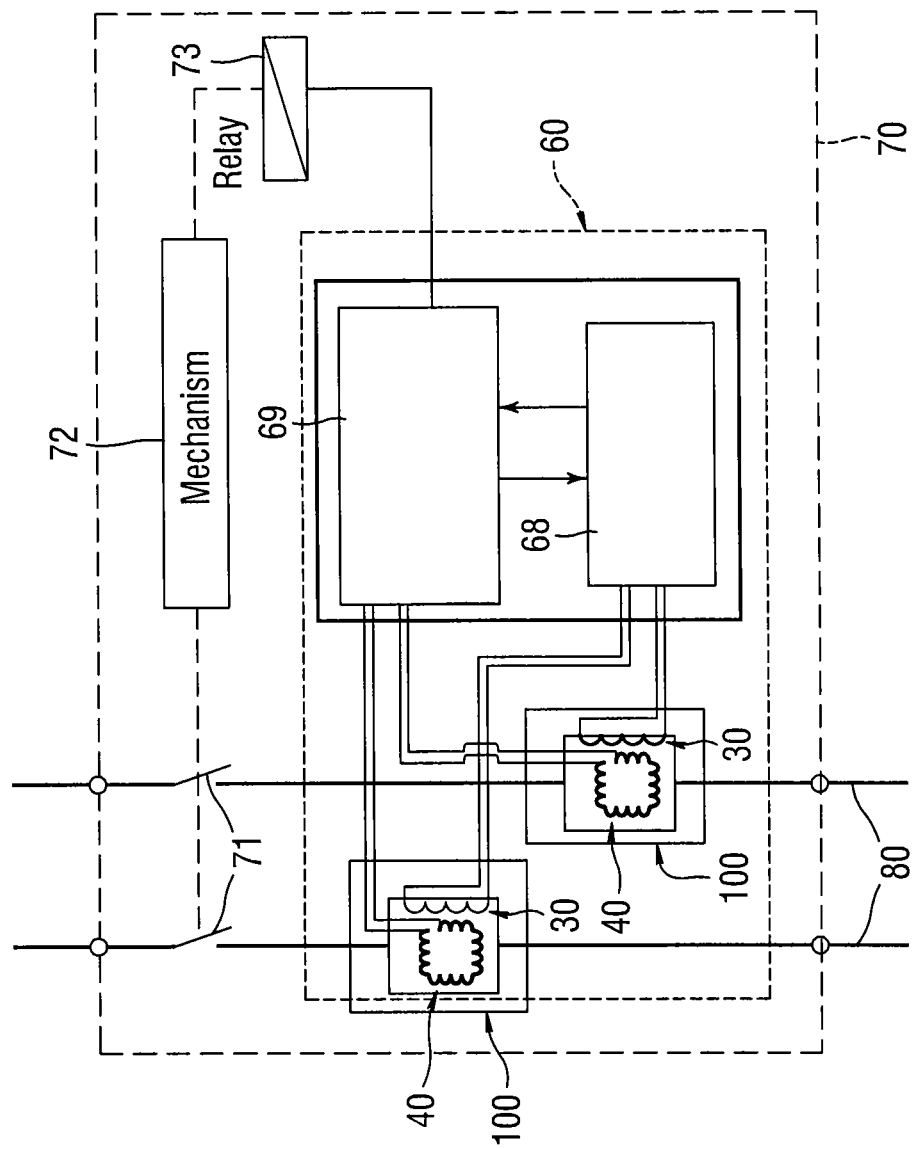
FIG. 12 represents an operating diagram of a switchgear device according to an embodiment of the invention and comprising a mixed electric current sensor according to FIGS. 1A and 1B.

Said means are supplied by the second coil 31 of the magnetic current sensor 30. As an application example as represented in FIG. 12, the magnetic current sensors 30 of the mixed current sensor 100 can be connected to a general power supply box 68 of a trip device 60, said device then forming part of a switchgear device 70 such as a circuit breaker.

According to one embodiment as represented in FIGS. 2A to 4, the current measurement device 40 comprises a first linking cassette 10 comprising first and second linking means 11, 12. The first housing 52 of the base 51 comprises a wall having an opening for passage of the first linking cassette 10.

The first linking means 11 are arranged to position, secure and fix said first cassette 10 by clip-fastening on the coil 41 of the current measurement device 40. The purpose of the invention is to be able to fix the first cassette 10 in a reproducible position thereby facilitating assembly of the mixed current sensor 100. The insulating shell 43 on which the coil 41 of the current measurement device 40 is wound then comprises clip-fastening means 44 designed to collaborate with the first linking means 11 of the first linking cassette 10.

Figure 3:
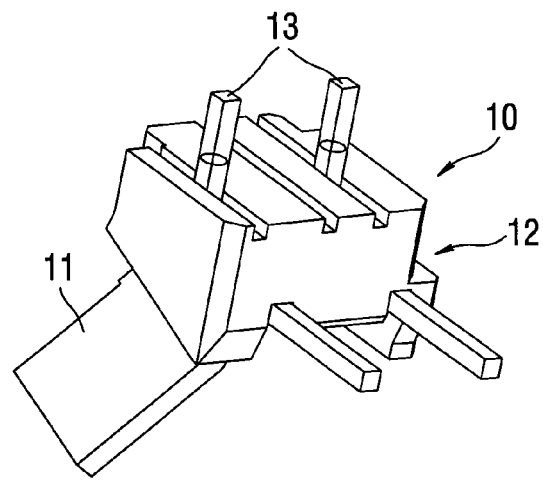
FIGS. 3 and 4 represent detailed views of manufacturing of the current measurement device according to FIGS. 2A and 2B.

According to a particular embodiment, the first linking means 11 comprise a protuberance salient with respect to the body of the first cassette 10. The protuberance is designed to fit into a hole 44 made in the insulating shell 43. The hole comprises a longitudinal axis Y substantially perpendicular to an axis of revolution Z of the coil of the shell 43. Preferably, as represented in FIG. 3, the cross-section of the protuberance is substantially rectangular. Certain faces of the protuberance comprise stop means (not shown) designed to block movement of the cassette 10 in a direction parallel to the longitudinal axis Y once the protuberance is positioned in the hole.

The clip-fastening means 44 of the shell 43 and the first linking means 11 of the first linking cassette 10 form a tenon and mortar system. This linking preferably does however present a functional clearance to absorb the different heights of coils and to prevent tensions on the wires.

The second linking means 12 of the linking cassette 10 are arranged to position and secure said cassette and the measurement device 40 on the case 50. The object of the invention is to be able to fit the assembly formed by a linking cassette 10 and the measurement device 40 to the case 50 in a reproducible position thereby facilitating fitting of the mixed current sensor 100.

Figure 4:
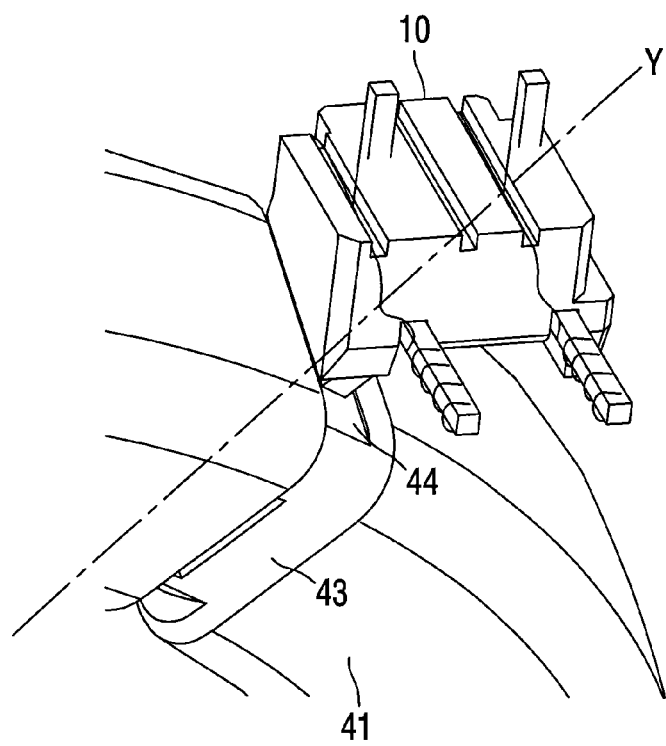
Figure 5:
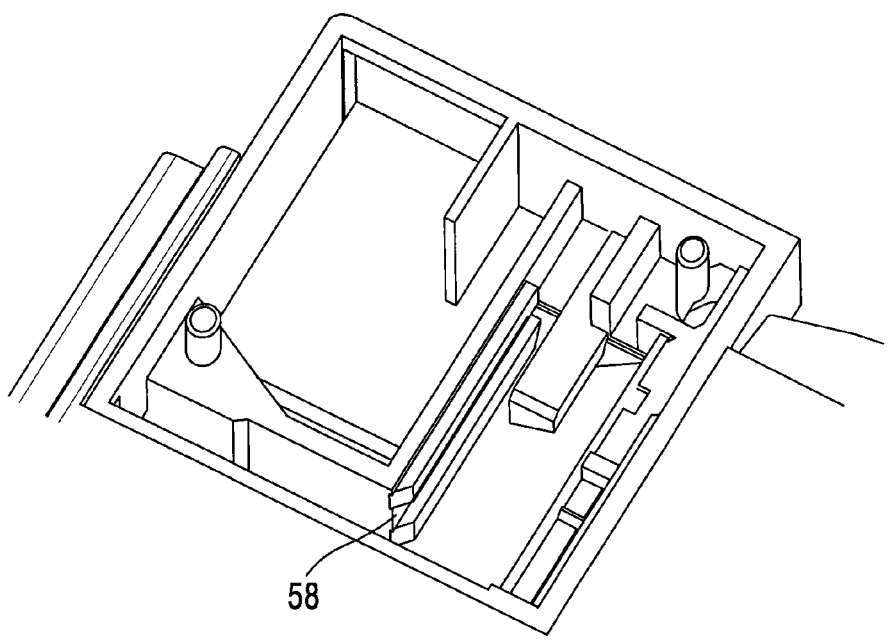
FIGS. 5 and 6 represent detailed views of a mixed electric current sensor in the course of assembly according to the FIGS. 1A and 1B.
Figure 6:
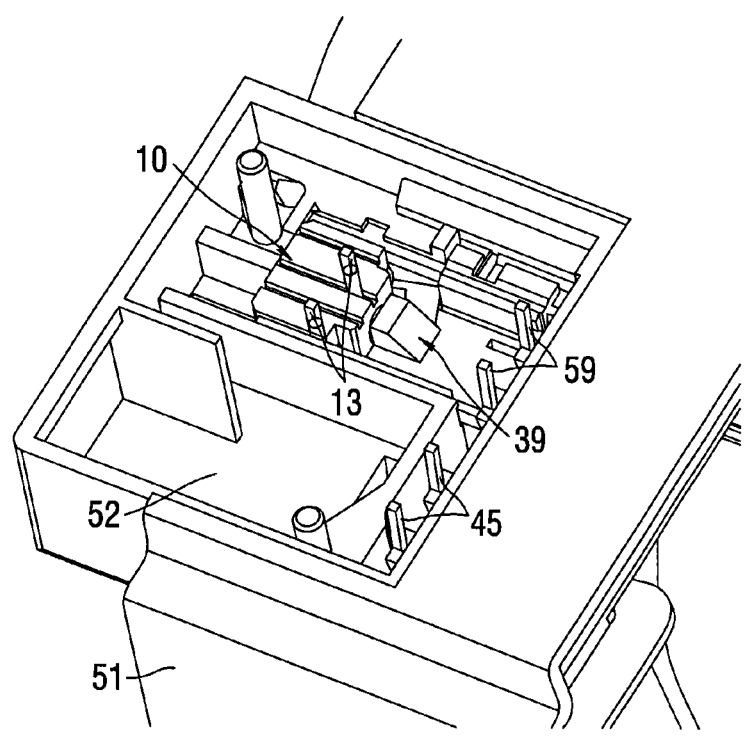

As an example embodiment as represented in FIGS. 3 and 4, the second linking means 12 comprise at least one positioning slide salient with respect to the body of the cassette 10 to position said cassette 10 and the measurement device 40 on the case 50. The housing 52 then comprises grooves 58 in which the positioning slides of the first linking cassette 10 are positioned. The second linking means 12 of the first linking cassette 10 thus form a tenon and mortar system with the housing 52 of the base 51. The slides move in the grooves of the base in a substantially parallel direction to the axis of revolution Z of the coil 41.

The first linking cassette 10 comprises electric pins 13 respectively connected to the first coil 41 and to the electronic acquisition means 20. As an example embodiment, the electric pins 13 are welded to the electronic acquisition means 20. An automated welding method by laser tin brazing can be used. The electronic acquisition means 20 also preferably comprise connection pads 26 designed to be connected to a connector.

Figure 7:
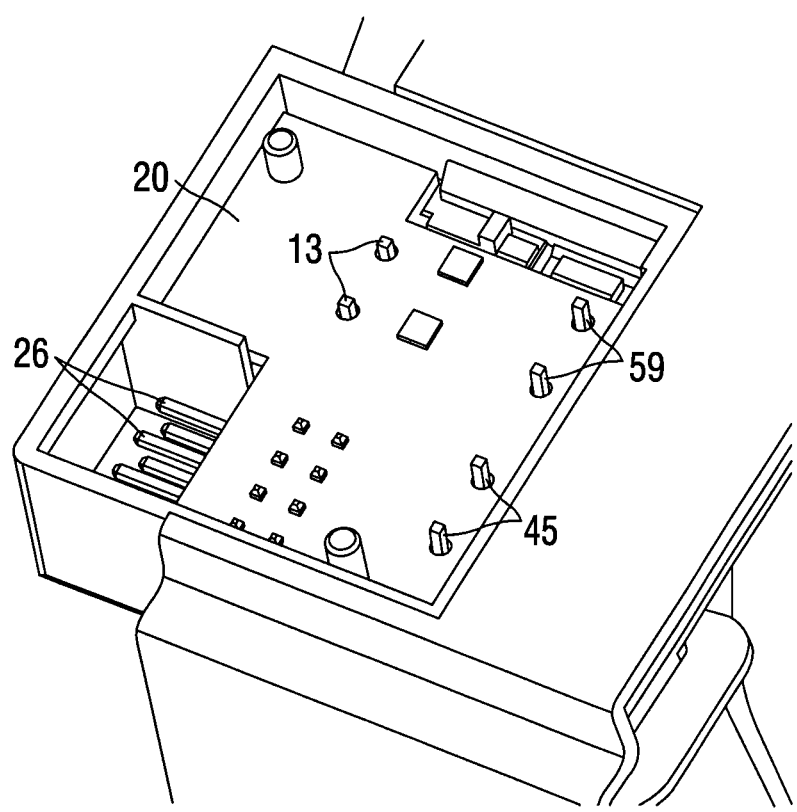
FIG. 7 represents a perspective view of the electronic means for performing electric current acquisition and measurement of a current measurement device of the mixed electric current sensor according to FIGS. 1A and 1B.

As represented in FIG. 7, the electronic means 20 comprise a printed circuit plate arranged to be positioned inside the walls of the housing 52. Said printed circuit plate comprises holes 21 enabling passage by engagement of the electric pins 13 of the first linking cassette 10. The case 50 comprises a first flat cover 55 designed to be fixed by welding onto outer edges of the walls of the first housing 52 of the base 51.

The case comprises a base 51 comprising a second housing 53 having walls inside which the current measurement device 40 and the magnetic current sensor 30 are positioned.

According to a preferred embodiment as represented in FIGS. 1A and 1B, the outer edge 54 of the walls extends in the direction of a plane. The case 50 comprises a second flat cover 57 designed to be fixed by welding onto the outer edge 54 of the walls of the second housing 53 of the base 51.

Figure 8:
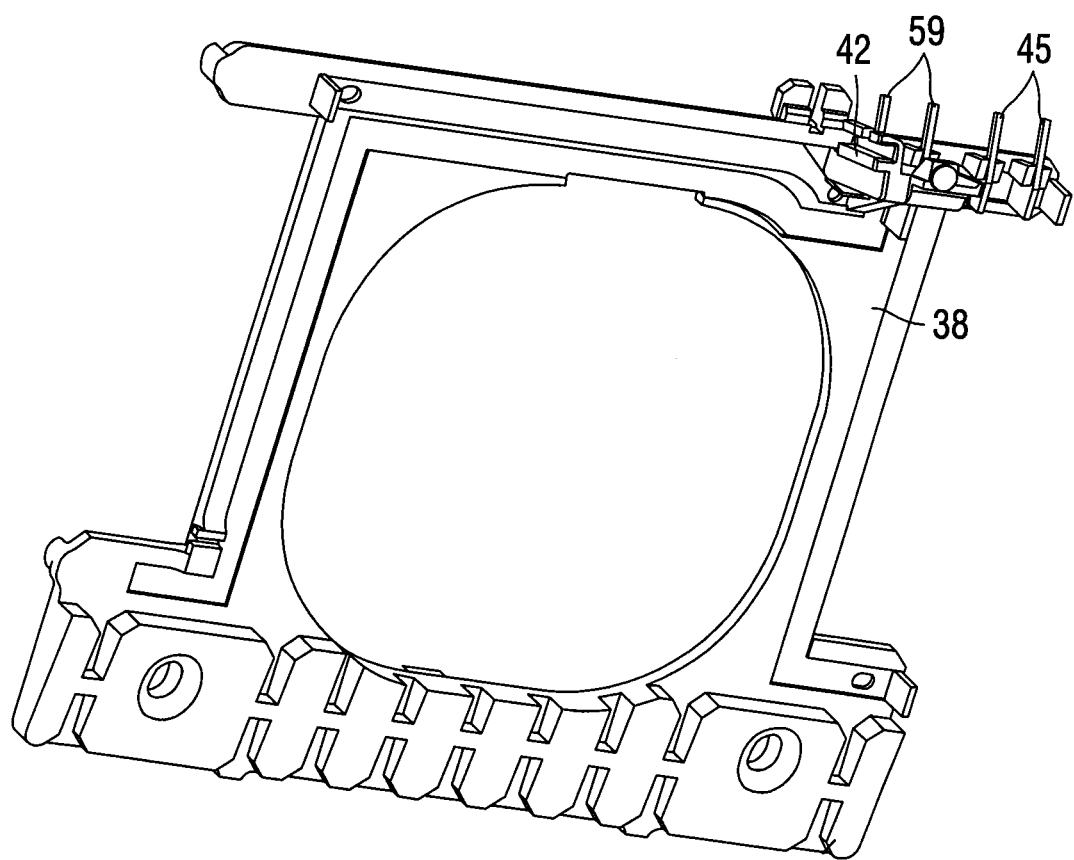
FIGS. 8 and 9 represent perspective views of a magnetic current sensor of the mixed electric current sensor according to FIGS. 1A and 1B.
Figure 9:
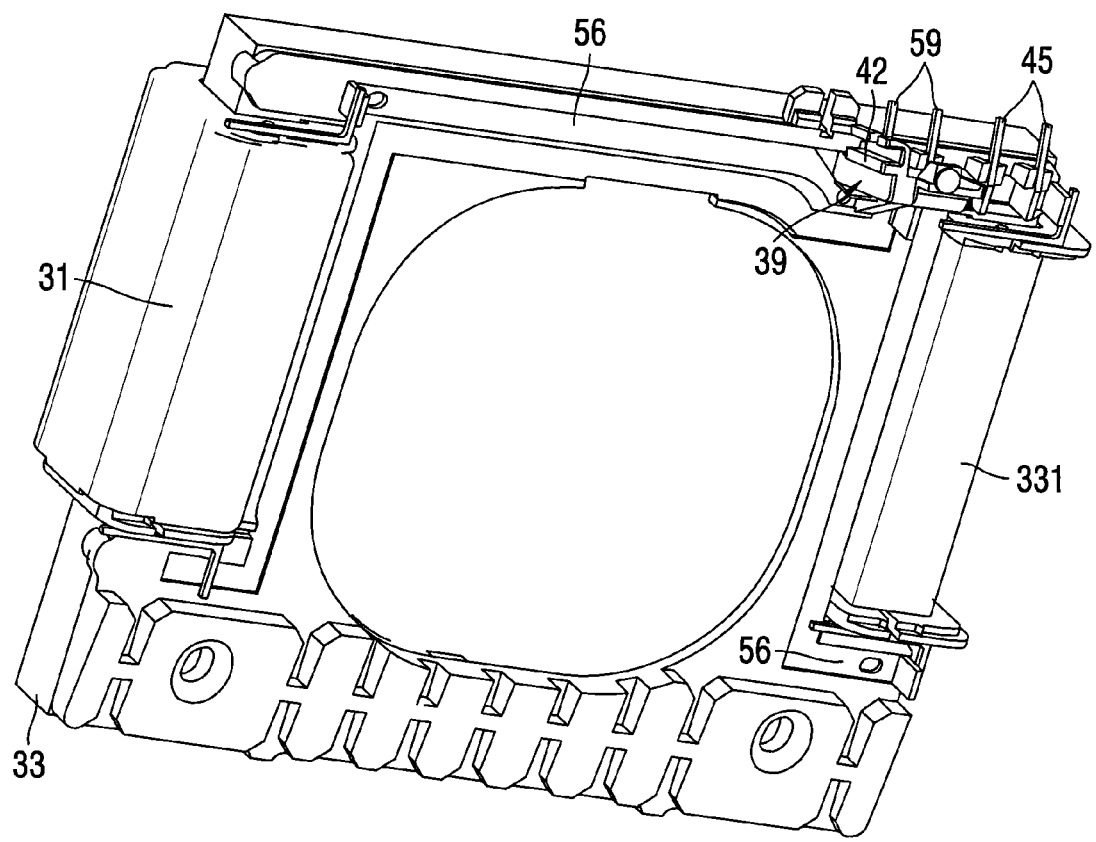

According to an embodiment as represented in FIGS. 8 and 9, the magnetic current sensor 30 comprises a second linking cassette 39 comprising third linking means 42. The third linking means 42 of the second linking cassette 39 are arranged to position, secure and fix said cassette and the magnetic current sensor 30 on the case 50. The third linking means 42 are further also arranged to fix the first cassette 10 and the measurement device 40 on the case 50. The object of the invention is to be able to fix both the measurement device 40 and the magnetic current sensor 30 on the case 50 in a reproducible position thereby facilitating fitting of the mixed current sensor 100.

The magnetic current sensor 30 comprises at least one second coil 31 wound around a magnetic circuit 33. The assembly formed by the second coil 31 and the magnetic circuit 33 is fixed onto an insulating support plate 38. According to one embodiment, the second linking cassette 39 is fixed onto the insulating support plate 38. As an example embodiment, the second linking cassette 39 and the insulating support plate 38 are preferably moulded in a single part.

The magnetic current sensor 30 is connected to the electronic acquisition and measurement means 20 of the electric current by pins 59. Rigid electric tracks 56 fixedly secured to the insulating support plate 38 connect the pins to the second coil 31. The printed circuit plate of the electronic means 20 then comprises holes 21 enabling passage by engagement of the electric pins 59 of the second linking cassette 39. An automated welding method by laser tin brazing can be used to weld said pins 59 to the printed circuit plate of the electronic acquisition means 20. The second coil 31 is particularly designed to perform electric power supply of the electronic acquisition means 20.

As an example embodiment as represented in FIGS. 8 and 9, the third linking means 42 of the second linking cassette 39 are designed to position the insulating support plate 38 supporting the magnetic sensor 30 on the case 50. According to a particular embodiment, the third linking means 42 comprise a positioning slide salient with respect to the body of the second linking cassette 39. The positioning slides enable fixing of the assembly formed by the cassette 39 and magnetic sensor 30 in the housing 52 of the base 51 of the case 50. The positioning slides 42 of the second cassette 39 are housed in the same grooves 58 as the positioning slides of the first linking cassette 10. The positioning slides of the second linking cassette 39 thus form a tenon and mortar system with the housing 52 of the base 51. The positioning slides 42 move in the grooves 58 of the base 51 in a substantially parallel direction to the axis of revolution of the coil 41.

The grooves 58 of the housing 52 comprise stop means designed to collaborate with slides 42 of the second cassette 39 at the end of translational movement of said slides in the housing 52. Said stop means are designed to block the translational movement of the second cassette 39 in the housing when the latter is entirely positioned in the housing.

According to a mode of development of the invention, the magnetic current sensor 30 comprises a second coil 331 wound around a magnetic circuit 33. The assembly formed by the second coil 331 and the magnetic circuit is fixed on the insulating support plate 38 comprising the second linking cassette 39. The magnetic current sensor 30 is connected to the electronic acquisition and measurement means 20 of the electric current by rigid electric tracks 56 secured to the insulating support plate 38. The electric tracks 56 comprise pins 45 at their ends. An automated welding method by laser tin brazing can be used to weld said pins 45 of the electric tracks 56 to the printed circuit plate of the electronic acquisition means 20. The second coil is particularly designed to perform measurements of sharp variations of the electric current (di/dt) flowing in the electric conductor 80.

The invention also relates to a method for fitting a mixed current sensor 100 as defined in the above.

The method consists in a first step of fixing the first linking cassette 10 on the insulating shell 43 of the current measurement device 40. The wires of the coil 41 are electrically connected to the electric pins 13 of the cassette 10.

In a second step, the assembly formed by the first linking cassette 10 and the insulating shell 43 is then positioned in the housing 52 of the base of the case 50. According to this embodiment, the positioning slides of the second linking means 12 collaborating with the grooves 58 of the base 51 enable positioning of the measurement device 40 on the case 50. The measurement device 40 is immobile in two directions but remains free in the direction of insertion of said module, a direction aligned with the slides.

The following step consists in fixing the magnetic current sensor 30 in the base 51 of the case 50.

The assembly formed by the second cassette 39 and the insulating support plate 38 supporting the magnetic sensor 30 is then positioned in the housing 52 of the base 51 of the case 50. The slides of the second cassette 39 collaborate with the grooves 58 of the base 51 of the case 50. Stacking of the first cassette 10 and the second cassette 39 is then observed.

The stop means of the grooves 58 of the base 51 collaborating with the second cassette 39 disable translational movement of both the first and second cassette 10, 39 in the housing when the second cassette 39 is entirely positioned in the housing.

Securing means 36 enable the stacking of the magnetic sensor 30 and of the current measurement device 40 to be maintained in the base of the case 50. An electric connection is made between the electric tracks 56 and the coil 31 of the magnetic sensor 30. The connection can be made for example by electric welding. According to one embodiment, the securing means 36 are preferably unable to be disassembled. This type of securing means does away with the usual necessity of fitting a compensating seal to secure the magnetic sensor 30 and the current measurement device 40.

The printed circuit plate of the electronic acquisition means 20 is then positioned inside the walls of the first housing 52. The electric pins 13 of the linking cassette 10 pass through holes 21 present on the circuit. The electric pins 59 of the electric tracks 56 also pass through holes 21 on the circuit. All the electric pins 13, 59 are then preferably welded by an automated welding method by laser tin brazing. A first cover 55 is then positioned on the outer edges of the walls of the first housing 52. The outer edges preferably extend in a plane. The first cover 55 extending in a plane is then welded onto said edge.

In a last step, a second cover 57 is positioned on the outer edge 54 of the walls of the second housing 53 of the base 51. The second cover extending in a plane is then welded onto said outer edge 54.

Figure 10:
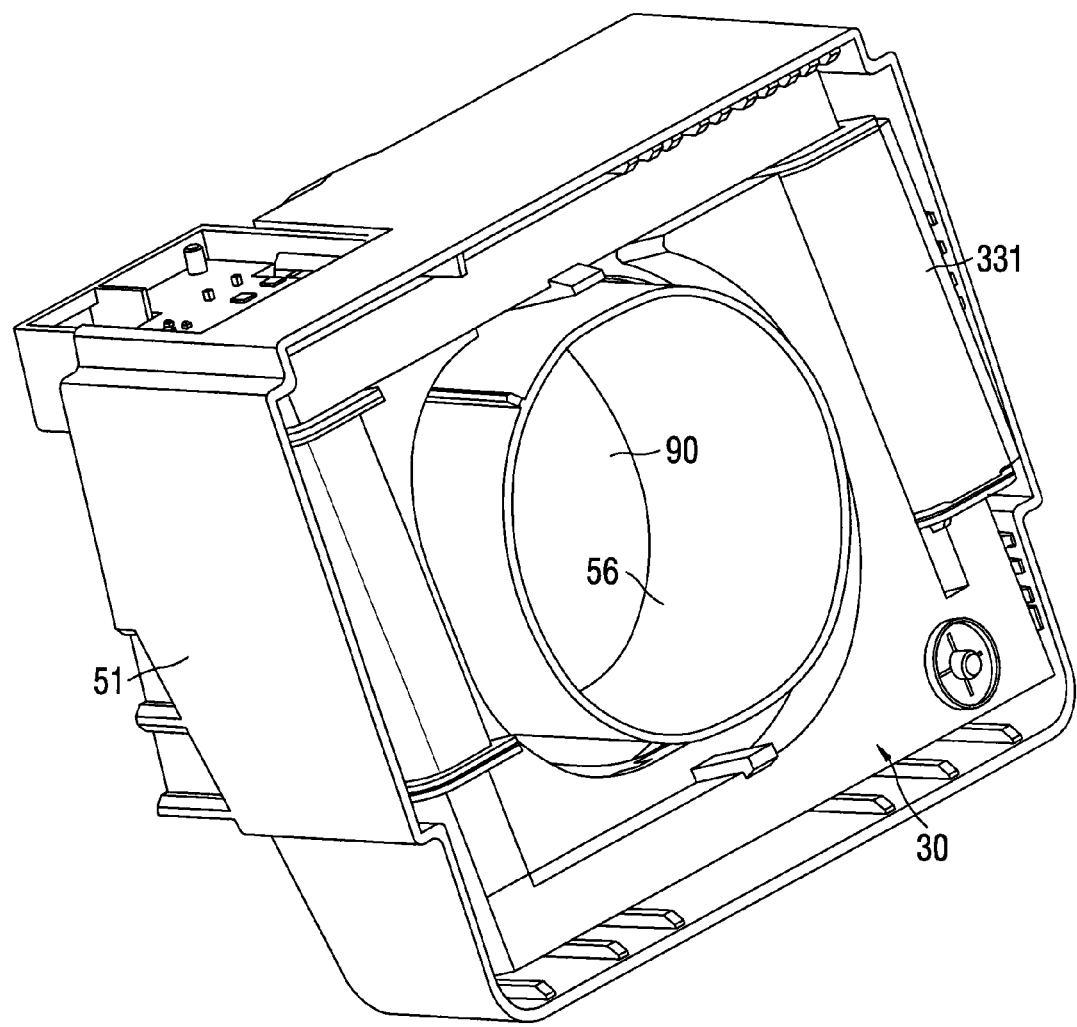
FIGS. 10 and 11 represent perspective views of the mixed electric current sensor in the course of fitting according to FIGS. 1A and 1B.
Figure 11:
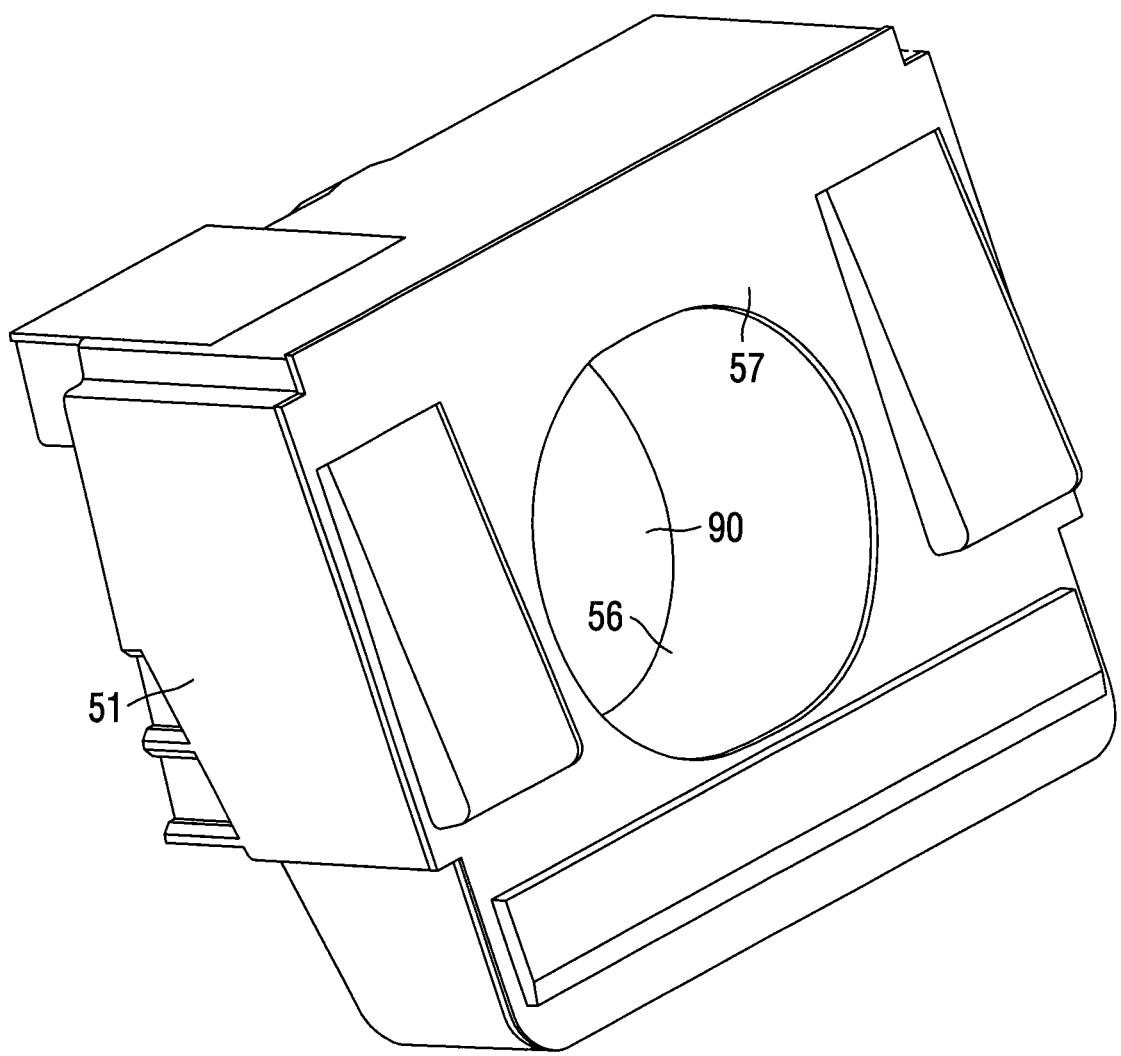

As represented in FIG. 10, one or more mixed current sensors 100 can then be integrated in an electric trip device 60 designed to command a switchgear device 70 such as a circuit breaker. The circuit breaker 70 is fitted on electric current conductors or lines 80. The switchgear device 70 comprises an opening mechanism 72 of electric contacts 71 via a relay 73.

The magnetic current sensors 30 are then connected to the general power supply box 68 of the trip unit 60. The power supply means 68 are thus connected to said mixed current sensor 100 to receive at least one power supply signal.

The current measurement devices 40 according to the invention are connected to the general processing means 69. The processing means 69 are thus connected to said mixed current sensor 100 to receive at least one signal representative of a primary current flowing in the lines 80.

The general processing means 69 are themselves supplied by the general power supply box 68. As represented in FIG. 10, several electric poles of the installation can each comprise a mixed current sensor 100 comprising a magnetic current sensor 30 and a current measurement device 40. If the general processing means 69 receive information of a fault present on at least one of the lines 80, via the current measurement devices 40, an opening command order of the contacts 71 can be sent to the opening mechanism 72 via the relay 73.

The invention claimed is:

1. A mixed current sensor in a case, the mixed current sensor comprising:
   a current measurement device comprising a first coil of Rogowski type;
   a magnetic current sensor having a second coil wound around a magnetic circuit,
      the current measurement device and the magnetic current sensor being arranged in such a way as to have a same primary circuit;
   electronic acquisition and measurement means of electric current;
   a first linking cassette comprising:
      first linking means arranged to position and fix said first linking cassette to the first coil by clip-fastening; and
      second linking means arranged to position and secure said first linking cassette and the current measurement device on the case; and
   a second linking cassette comprising:
      third linking means arranged to position, secure and fix by clip-fastening:
         the magnetic current sensor on the case; and
         the first linking cassette and the current measurement device on the case;
      the first and second cassettes comprising electric pins respectively connecting the first and second coils to the electronic acquisition and measurement means, wherein
   the first linking cassette and the second linking cassette are fixed to the case using a groove of a housing of the case such that the second linking means of the first linking cassette collaborates with the groove by sliding the second linking means in the groove, and the second linking cassette collaborates with the groove by sliding the second linking cassette in the groove, and thereby the first linking cassette and the second linking cassette are stacked.

2. The mixed current sensor according to claim 1, wherein the first coil of the current measurement device is wound on an insulating shell comprising clip-fastening means designed to collaborate with the first linking means of the linking cassette.

3. The mixed current sensor according to claim 2, wherein the clip-fastening means of the insulating shell and the first linking means of the first linking cassette form a tenon and mortar system.

4. The mixed current sensor according to claim 1, wherein the second linking means of the first linking cassette comprise a positioning slide salient with respect to a body of said linking cassette, said positioning slide being designed to be housed in the groove of the housing of the case to form a tenon and mortar system.

5. The mixed current sensor according to claim 1, wherein an assembly formed by the second coil and the magnetic circuit is fixed onto an insulating support plate, the second linking cassette being secured to the insulating support plate.

6. The mixed current sensor according to claim 5, wherein the third linking means of the second linking cassette comprise a positioning slide salient with respect to a body of the second linking cassette, said positioning slide being designed to be housed in the groove and a positioning slide of the first linking cassette being designed to be housed in the groove to form a tenon and mortar system.

7. The mixed current sensor according to claim 6, wherein the groove of the housing of the case comprise stop means designed to collaborate with slides of the second linking cassette at the end of translational movement of said slides in the housing, said stop means being designed to block translational movement of both the first and second linking cassettes.

8. The mixed current sensor according to claim 1, wherein an assembly formed by the second coil and the magnetic circuit is fixed onto an insulating support plate.

9. The mixed current sensor according to claim 1, wherein the electronic acquisition and measurement means are positioned in a first housing of a base of the case, one of walls of said first housing comprising an opening for passage of the first and second linking cassettes.

10. The mixed current sensor according to claim 9, wherein the case comprises a first flat cover designed to be fixed by welding onto an outer edge of the walls of the first housing of the base.

11. The mixed current sensor according to claim 9, wherein the electronic acquisition and measurement means comprise a printed circuit plate arranged to be positioned inside the walls of the housing, a plate of the printed circuit comprising holes allowing passage and engagement of the electric pins of the first and second linking cassettes.

12. The mixed current sensor according to claim 9, wherein the base comprises a second housing having walls inside which the magnetic current sensor and the current measurement device are positioned, the outer edge of the walls extending according to a plane.

13. The mixed current sensor according to claim 12, wherein the case comprises a second flat cover designed to be fixed by welding onto the outer edge of the walls of the second housing of the base.

14. The mixed current sensor according to claim 1, wherein the electronic acquisition and measurement means of the electric current are supplied by the second coil of the magnetic current sensor.

15. A method for fitting a mixed current sensor in a case, the mixed current sensor including:
   a current measurement device comprising a first coil of Rogowski type;
   a magnetic current sensor having a second coil wound around a magnetic circuit,
      the current measurement device and the magnetic current sensor being arranged in such a way as to have a same primary circuit;
   electronic acquisition and measurement means of electric current;
   a first linking cassette comprising:
      first linking means arranged to position and fix said first linking cassette to the first coil by clip-fastening; and
      second linking means arranged to position and secure said first linking cassette and the current measurement device on the case; and
   a second linking cassette comprising:
      third linking means arranged to position, secure and fix by clip-fastening:
         the magnetic current sensor on the case; and
         the first linking cassette and the current measurement device on the case;
   the first and second cassettes comprising electric pins respectively connecting the first and second coils to the electronic acquisition and measurement means,
   the first linking cassette and the second linking cassette being fixed to the case using a groove of a first housing of the case such that the second linking means of the first linking cassette collaborates with the groove by sliding the second linking means in the groove, and the second linking cassette collaborates with the groove by sliding the second linking cassette in the groove, and thereby the first linking cassette and the second linking cassette are stacked, and
   the method comprising:
   fixing of the first linking cassette on an insulating shell of the current measurement device, wires of the first coil being electrically connected to the electric pins of the first linking cassette;
   positioning of an assembly formed by the first linking cassette and the insulating shell supporting the first coil in the case, the first linking cassette enabling positioning of the current measurement device in the case;
   positioning of an assembly formed by the second linking cassette and the second coil in the case, the second linking cassette enabling positioning and fixing:
      of the current measurement device on the case; and
      of the magnetic current sensor;
   electric welding of tracks onto the second coil of the magnetic current sensor;
   positioning of a printed circuit plate of the electronic acquisition and measurement means inside walls of the first housing;
   welding of the electric pins of the first linking cassette and of the electric pins of tracks onto the electronic acquisition and measurement means;
   positioning and welding of a first cover on the outer edges of the walls of the first housing; and
   positioning and welding of a second cover on the outer edge of walls of a second housing of a base.

16. A mixed current sensor in a case, the mixed current sensor comprising:
   a current measurement circuit comprising a first coil of Rogowski type;
   a magnetic current sensor having a second coil wound around a magnetic circuit,
      the current measurement circuit and the magnetic current sensor being arranged in such a way as to have a same primary circuit;
   electronic acquisition and measurement circuit of electric current;
   a first linking cassette comprising:
      a first linking part arranged to position and fix said first linking cassette to the first coil by clip-fastening; and
      a second linking part arranged to position and secure said first linking cassette and the current measurement circuit on the case; and
   a second linking cassette comprising:
      a third linking part arranged to position, secure and fix by clip-fastening:
         the magnetic current sensor on the case; and
         the first linking cassette and the current measurement circuit on the case;
   the first and second cassettes comprising electric pins respectively connecting the first and second coils to the electronic acquisition and measurement circuit, wherein
   the first linking cassette and the second linking cassette are fixed to the case using a groove of a housing of the case such that the second linking part of the first linking cassette collaborates with the groove by sliding the second linking part in the groove, and the second linking cassette collaborates with the groove by sliding the second linking cassette in the groove, and thereby the first linking cassette and the second linking cassette are stacked.

* * * * *